United States Patent
Hayashi et al.

(10) Patent No.: US 12,385,132 B2
(45) Date of Patent: Aug. 12, 2025

(54) SUBSTRATE PROCESSING APPARATUS AND SUBSTRATE PROCESSING METHOD

(71) Applicant: Tokyo Electron Limited, Tokyo (JP)

(72) Inventors: Ibuki Hayashi, Iwate (JP); Yasushi Takeuchi, Iwate (JP); Manabu Honma, Iwate (JP); Junnosuke Taguchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/163,949

(22) Filed: Feb. 3, 2023

(65) Prior Publication Data

US 2023/0257877 A1      Aug. 17, 2023

(30) Foreign Application Priority Data

Feb. 17, 2022   (JP) ................. 2022-023083

(51) Int. Cl.
    *C23C 16/44*      (2006.01)
    *C23C 16/458*      (2006.01)
    *H01L 21/67*      (2006.01)

(52) U.S. Cl.
    CPC ...... *C23C 16/4412* (2013.01); *C23C 16/4584* (2013.01); *H01L 21/67017* (2013.01)

(58) Field of Classification Search
CPC ............ C23C 16/4412; C23C 16/4584; C23C 16/45519; C23C 16/4585; C23C 16/45574; C23C 16/46; C23C 16/52; C23C 16/44; C23C 16/4409; C23C 16/54; C23C 16/45551; C23C 16/545; C23C 14/568; C23C 16/4401; H01L 21/67017; H01L 21/6719; H01L 21/67196; H01L 21/67201; H01L 21/67173; H01L 21/67184; H01L 21/6776; H01L 21/67161; H01L 21/67155; H01L 21/67069; H01L 21/67748; H01L 21/67751; H01L 21/67745; H01J 37/32834
USPC .............. 118/719, 715; 156/345.31, 345.32, 156/345.33, 345.34
See application file for complete search history.

(56) References Cited

U.S. PATENT DOCUMENTS

| | | | |
|---|---|---|---|
| 8,043,432 B2 * | 10/2011 | Dip ........................ | C23C 16/54 |
| | | | 118/719 |
| 9,567,669 B2 * | 2/2017 | Cho ................... | H01L 21/68771 |
| 11,473,196 B2 * | 10/2022 | Ohashi .............. | C23C 16/45551 |

(Continued)

FOREIGN PATENT DOCUMENTS

| JP | 2010-114391 | 5/2010 |
|---|---|---|
| JP | 2013-026460 | 2/2013 |

(Continued)

*Primary Examiner* — Rudy Zervigon
(74) *Attorney, Agent, or Firm* — IPUSA, PLLC

(57) ABSTRACT

A substrate processing apparatus includes: a processing chamber; a rotary table rotatably provided inside the processing chamber; a stage that is rotatable relative to the rotary table at a position spaced apart from a rotation center of the rotary table; a process gas supplier provided above the rotary table; a separation gas supplier to supply a separation gas to separation regions, each of the separation regions being adjacent to a processing region; and a gas exhauster including exhaust ports communicating with an inside of the processing chamber, wherein the exhaust ports are provided in the processing region between the separation regions and are provided above the rotary table.

17 Claims, 5 Drawing Sheets

(56) References Cited

U.S. PATENT DOCUMENTS

| | | | | |
|---|---|---|---|---|
| 2010/0294199 A1* | 11/2010 | Tran | ................. | H01L 21/68785 |
| | | | | 118/723 R |
| 2011/0212625 A1* | 9/2011 | Toyoda | ............... | C23C 16/4585 |
| | | | | 438/758 |
| 2012/0145078 A1* | 6/2012 | Huang | ................ | C23C 16/4412 |
| | | | | 239/548 |
| 2015/0361553 A1* | 12/2015 | Murakawa | ........ | C23C 16/45561 |
| | | | | 156/345.55 |
| 2016/0160349 A1* | 6/2016 | Cho | ................. | H01L 21/68771 |
| | | | | 438/22 |
| 2016/0172183 A1* | 6/2016 | Kamada | ................ | C23C 16/345 |
| | | | | 438/792 |
| 2017/0218515 A1* | 8/2017 | Shin | .................... | C23C 16/4412 |
| 2017/0287677 A1* | 10/2017 | Kato | .................. | H01J 37/3244 |
| 2021/0130950 A1* | 5/2021 | Hane | ................. | C23C 16/45574 |
| 2021/0156024 A1* | 5/2021 | Roh | ..................... | C23C 16/4412 |
| 2021/0217651 A1* | 7/2021 | Taguchi | ............ | H01L 21/68792 |
| 2021/0301397 A1* | 9/2021 | Ohashi | .................. | C23C 16/345 |

FOREIGN PATENT DOCUMENTS

| | | |
|---|---|---|
| JP | 2013-044419 | 3/2013 |
| JP | 2021-111758 | 8/2021 |

\* cited by examiner

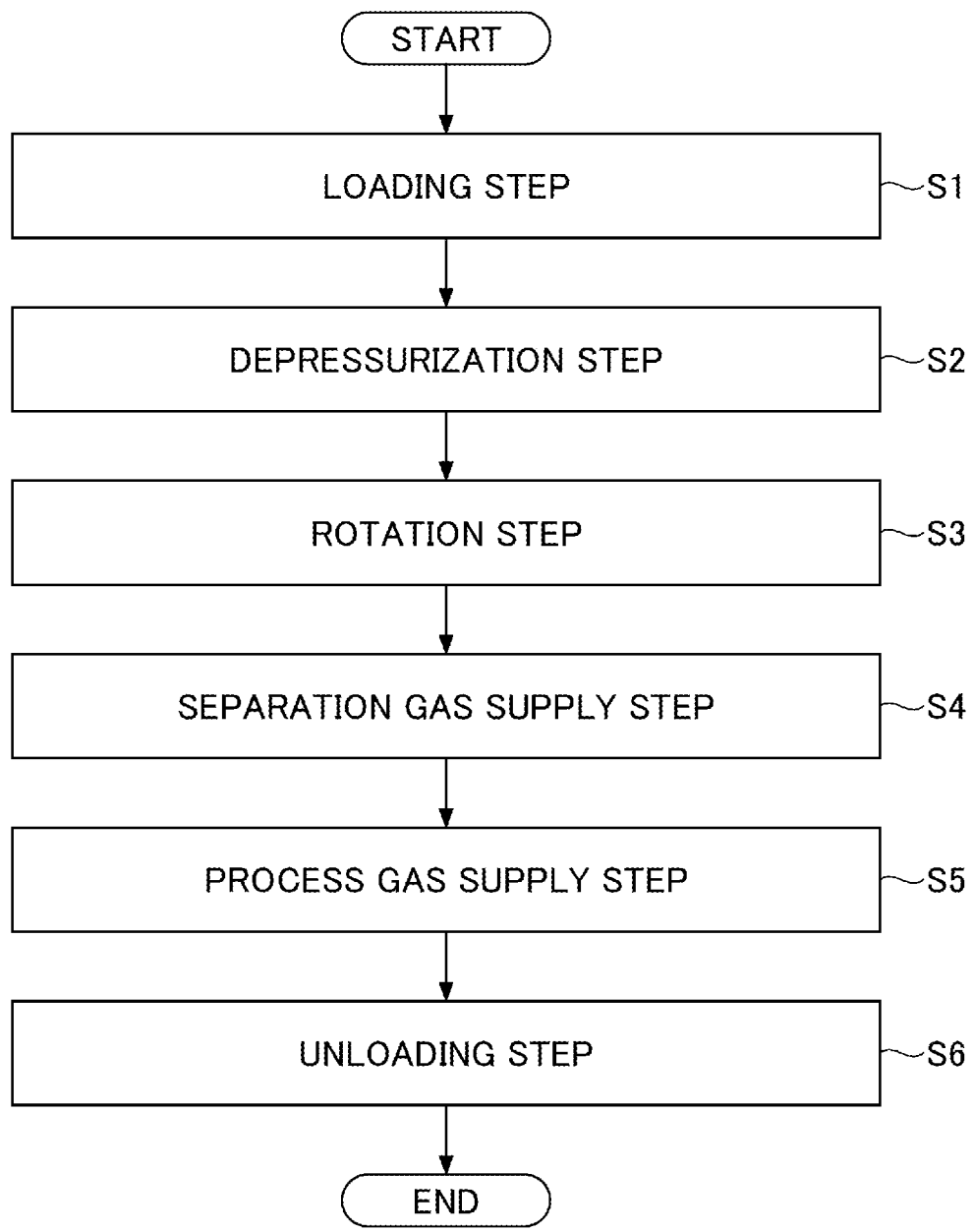

SUBSTRATE PROCESSING APPARATUS AND SUBSTRATE PROCESSING METHOD

CROSS-REFERENCE TO RELATED APPLICATIONS

The present application is based on and claims priority to Japanese Patent Application No. 2022-023083 filed on Feb. 17, 2022, the contents of which are incorporated herein by reference in their entirety.

BACKGROUND OF THE INVENTION

Field of the Invention

The present disclosure relates to a substrate processing apparatus and a substrate processing method.

Description of the Related Art

Japanese Laid-Open Patent Publication No. 2021-111758 discloses a substrate processing apparatus including a rotary table which is rotatable in a processing chamber and a plurality of stages that are provided on the rotary table and are rotatable relative to the rotary table. For example, the substrate processing apparatus may rotate the rotary table and the stage while supplying a plurality of process gases into the processing chamber to deposit a film on a substrate placed on each stage.

The substrate processing apparatus disclosed in Japanese Laid-Open Patent Publication No. 2021-111758 includes a separation gas supplier for supplying the separation gas between supplying the process gases, and a gas exhauster for exhausting each of the process gases and the separation gas from the processing chamber. The separation gas suppresses mixing of a first process gas and a second process gas in the processing chamber by separating the first process gas and the second process gas.

SUMMARY OF THE INVENTION

According to one aspect of the present disclosure, a substrate processing apparatus includes: a processing chamber into which a substrate is transferred; a rotary table rotatably provided inside the processing chamber; a stage that is rotatable relative to the rotary table at a position spaced apart from a rotation center of the rotary table, wherein the stage is configured to receive the substrate thereon; a process gas supplier that is provided above the rotary table and that is configured to supply a process gas to the substrate placed on the stage; a separation gas supplier that is configured to supply a separation gas to separation regions, each of the separation regions being adjacent to a processing region to which the process gas is supplied; and a gas exhauster that includes one or more exhaust ports communicating with an inside of the processing chamber and that are configured to exhaust a gas through the one or more exhaust ports, wherein the one or more exhaust ports are provided in the processing region between the separation regions and are provided above the rotary table.

BRIEF DESCRIPTION OF THE DRAWINGS

FIG. 4 is a flowchart illustrating a processing flow of a substrate processing method.

DESCRIPTION OF THE EMBODIMENTS

Figure 1:
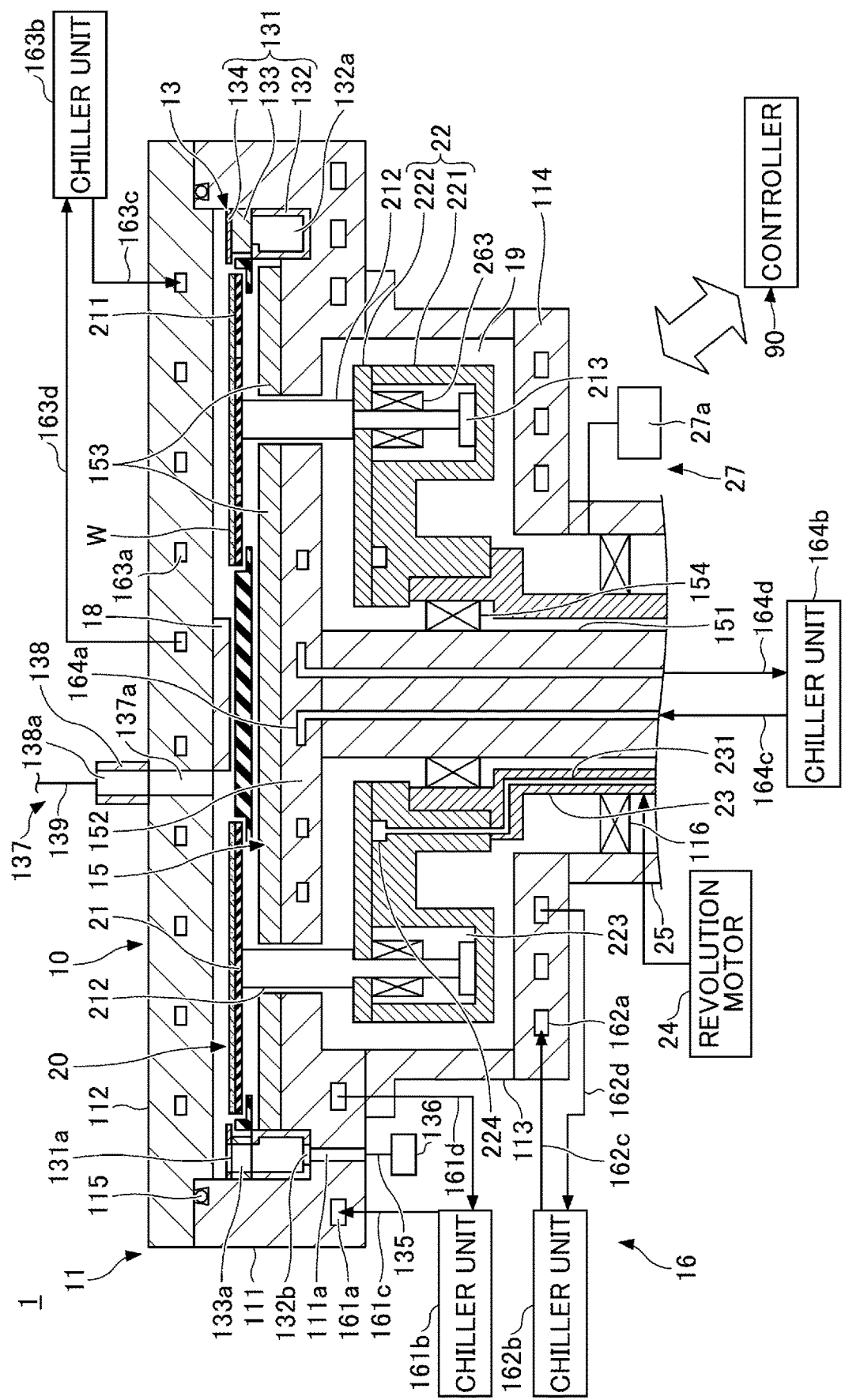
FIG. 1 is a longitudinal cross-sectional view illustrating a configuration example of a deposition apparatus according to an embodiment.

Hereinafter, embodiments of the present disclosure will be described with reference to the drawings. In each drawing, the same components are denoted by the same reference numerals, and overlapping descriptions are omitted.

[Substrate Processing Apparatus]

Figure 2:
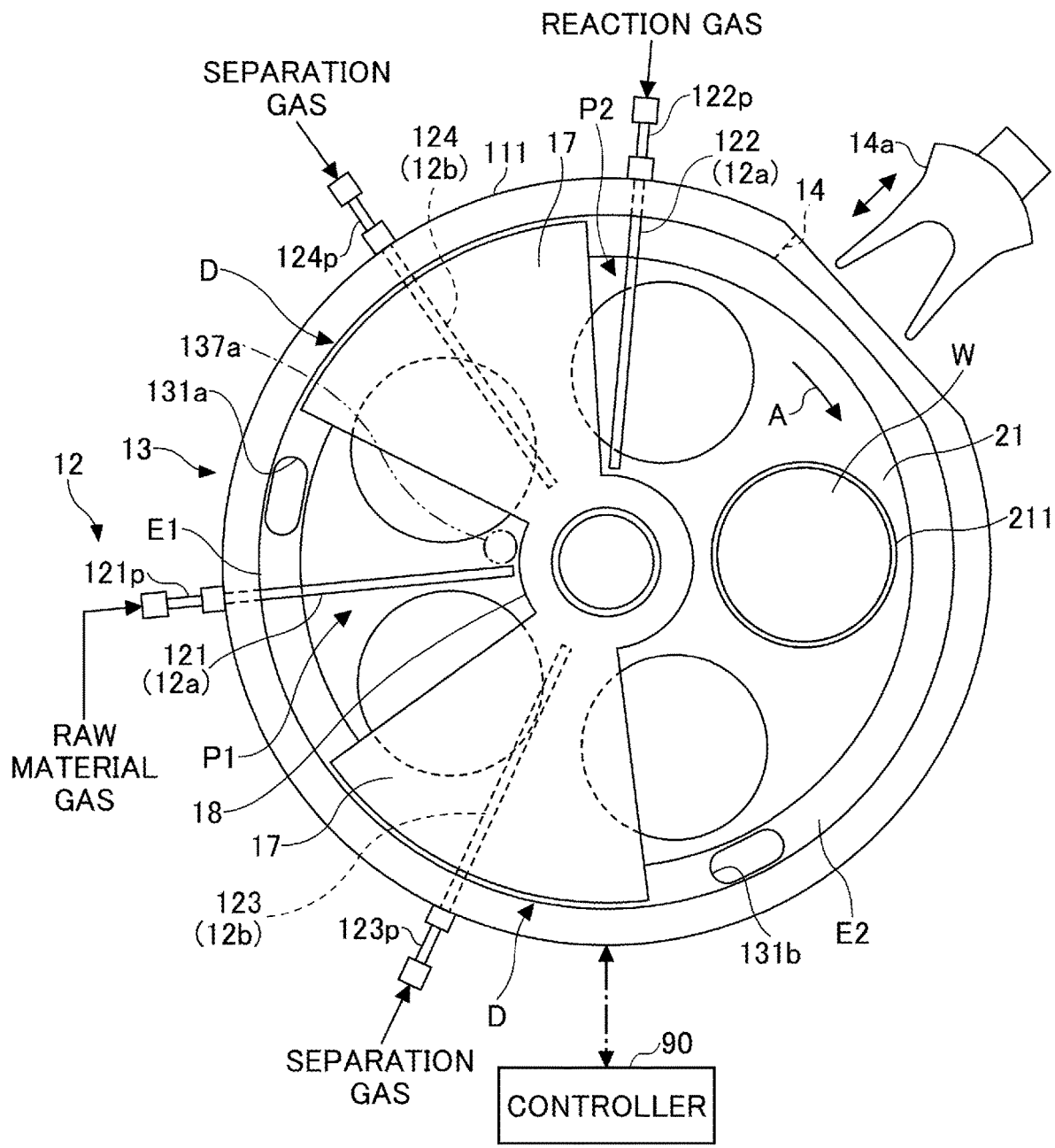
FIG. 2 is a plan view illustrating a configuration in a processing chamber of the deposition apparatus.
Figure 3:
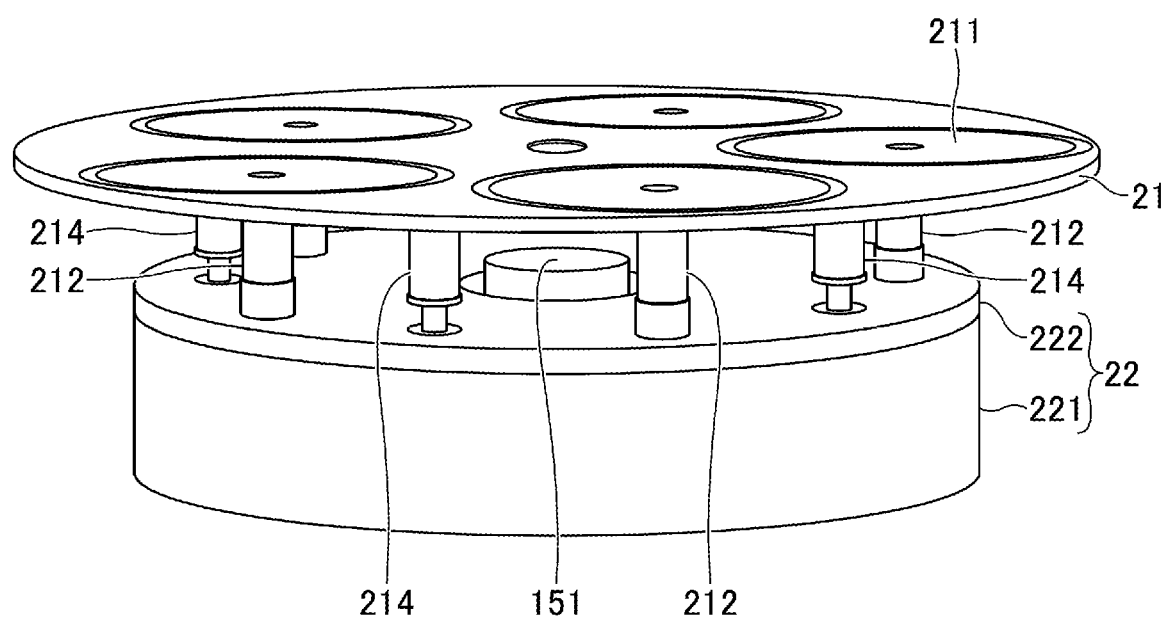
FIG. 3 is a perspective view illustrating a configuration of a rotary table and a stage of the deposition apparatus of FIG. 1.

Referring to FIGS. 1 to 3, a deposition apparatus 1 for forming a film on a substrate W, which is an example of a substrate processing apparatus, will be described. FIG. 1 is a longitudinal cross-sectional view illustrating a configuration example of a deposition apparatus 1 according to an embodiment. FIG. 2 is a plan view illustrating a configuration in a processing chamber 11 of the deposition apparatus 1 illustrated in FIG. 1. In FIG. 2, a top plate is not illustrated for convenience of explanation. FIG. 3 is a perspective view illustrating a configuration of a rotary table 21 and a stage 211 of the deposition apparatus 1 in FIG. 1.

The deposition apparatus 1 includes a processing unit 10, a rotary drive device 20, and a controller 90.

The processing unit 10 is configured to perform a deposition process of forming a film on the substrate W. The processing unit 10 includes a processing chamber 11, a gas introduction section 12, a gas exhauster 13, a loading port 14, a heating unit 15, and a cooling unit 16.

The processing chamber 11 is a vacuum chamber capable of depressurizing its interior space. The processing chamber 11 is formed to be a flat housing having an approximately circular shape in a planar view, and can accommodate a plurality of substrates W in its interior space. The substrate W may be, for example, a semiconductor wafer. The processing chamber 11 includes a body 111, a top plate 112, a sidewall 113, and a bottom plate 114 (FIG. 1). The body 111 has a cylindrical shape. The top plate 112 is detachably provided on the top of the body 111. The body 111 and the top plate 112 are hermetically sealed by a seal 115. The sidewall 113 has a cylindrical shape and is hermetically connected to the underside of the body 111. The bottom plate 114 is hermetically connected to the bottom of the sidewall 113.

The gas introduction section 12 includes a raw material gas nozzle 121 and a reaction gas nozzle 122, which are process gas suppliers 12a, and includes separation gas nozzles 123 and 124, which are separation gas suppliers 12b (FIG. 2). The raw material gas nozzle 121, the reaction gas nozzle 122, and the separation gas nozzles 123 and 124 are spaced apart from each other along a circumferential direction of the processing chamber 11 (as indicated by arrow A in FIG. 2) above the rotary table 21, which will be discussed below. In the illustrated example, the separation gas nozzle 123, the raw material gas nozzle 121, the separation gas nozzle 124, and the reaction gas nozzle 122 are arranged in this order clockwise from the loading port 14 (rotation direction of the rotary table 21). The raw material gas nozzle 121, the reaction gas nozzle 122, and the separation gas nozzles 123 and 124 each have gas inlet ports $121p$, $122p$, $123p$, and $124p$ (FIG. 2) at their proximal ends for introducing various gases. The gas inlet ports 121p, 122p, 123p, and 124p are fixedly attached to the sidewall of the body 111 and protrude outwardly from the body 111. The raw material gas nozzle 121, the reaction gas nozzle 122, and the separation gas nozzles 123 and 124 are inserted from the sidewall of the body 111 into the processing chamber 11 and extend radially inwardly of the body 111. The raw material gas nozzle 121, the reaction gas nozzle 122, and the separation gas nozzles 123 and 124 are formed, for example, by quartz and arranged parallel to the rotary table 21.

The raw material gas nozzle 121 is connected to a source (not illustrated) of the raw material gas through a piping, a flow controller, and the like (not illustrated). Examples of the raw material gas include a gas containing silicon and a gas containing metal. The raw material gas nozzle 121 is provided with a plurality of discharge holes (not illustrated) that open toward the rotary table 21. The plurality of discharge holes are arranged at intervals along the axial direction of the raw material gas nozzle 121. The region below the raw material gas nozzle 121 is a raw material gas adsorption region P1 in which the raw material gas is adsorbed on the substrate W.

The reaction gas nozzle 122 is connected to a source (not illustrated) of the reaction gas through a piping, a flow controller, and the like (not illustrated). Examples of the reaction gas include oxidized gas and nitride gas. The reaction gas nozzle 122 is provided with a plurality of discharge holes (not illustrated) that open toward the rotary table 21. The plurality of discharge holes are arranged at intervals along the axial direction of the reaction gas nozzle 122. The region below the reaction gas nozzle 122 is a reaction gas supply region P2 in which the raw material gas adsorbed on the substrate W in the raw material gas adsorption region P1 is oxidized or nitrided. In the present embodiment, the process gas for processing the substrate W is the raw material gas and the reaction gas.

The separation gas nozzles 123 and 124 are connected to a source (not illustrated) of the separation gas through a piping, a flow controller, and the like (not illustrated). Examples of the separation gas include an inert gas such as argon (Ar) gas, nitrogen (N₂) gas, and the like. The separation gas nozzles 123 and 124 are provided with a plurality of discharge holes (not illustrated) that open toward the rotary table 21. The plurality of discharge holes are arranged at intervals along the axial direction of the separation gas nozzles 123 and 124.

As illustrated in FIG. 2, two projecting portions 17 are provided in the processing chamber 11. The projecting portions 17 together with the separation gas nozzles 123 and 124 constitute the separation region D and are attached to the back surface of the top plate 112 so as to protrude toward the rotary table 21. Each of the projecting portions 17 has a fan shape in a planar view with the apex of the fan shape being cut in an arc shape, with an inner arc connected to a protrusion 18 and an outer arc positioned along the sidewall of the processing chamber 11.

The gas exhauster 13 discharges the process gas and the separation gas supplied into the processing chamber 11 to the exterior of the processing chamber 11. The configuration of the gas exhauster 13 will be described in detail below.

The loading port 14 is provided on the sidewall of the body 111 (FIG. 2). At the loading port 14, the substrate W is transferred between the rotary table 21 in the processing chamber 11 and a transfer arm 14a outside the processing chamber 11. The loading port 14 is opened and closed by a gate valve (not illustrated).

The heating unit 15 includes a stationary shaft 151, a heater support 152, and a heater 153 (FIG. 1). The stationary shaft 151 has a cylindrical shape centered on the center of the processing chamber 11. The stationary shaft 151 is provided inside the rotating shaft 23 of the rotary drive device 20 described below and through the bottom plate 114 of the processing chamber 11. The heater support 152 is fixedly connected to the top of the stationary shaft 151 and has a disc shape. The heater 153 is supported on the upper surface of the heater support 152. In addition to the upper surface of the heater support 152, the heater 153 may be provided on the body 111. The heater 153 generates heat by being supplied with power from a power source (not illustrated) to heat the substrate W.

The cooling unit 16 includes fluid flow passages 161a to 164a, chiller units 161b to 164b, inlet lines 161c to 164c, and outlet lines 161d to 164d. The fluid flow passages 161a to 164a are formed within the body 111, the top plate 112, the bottom plate 114, and the heater support 152, respectively. The chiller units 161b to 164b output a temperature control fluid. The temperature control fluid output from the chiller units 161b to 164b flows through the inlet lines 161c to 164c, the fluid flow passages 161a to 164a, and the outlet lines 161d to 164d in this order and circulates. Accordingly, the temperatures of the body 111, the top plate 112, the bottom plate 114, and the heater support 152 are adjusted. Examples of the temperature control fluid include water, a fluorine-based fluid such as Galden (registered trademark) and the like.

The rotary drive device 20 includes a rotary table 21, a housing box 22, a rotating shaft 23, a revolution motor 24, and an outer barrel 25.

The rotary table 21 is provided in the processing chamber 11 and has a rotation center at the center of the processing chamber 11. The rotary table 21 has a disc shape, for example, and is formed of quartz. A plurality of (for example, five) stages 211 are provided on the upper surface of the rotary table 21 along the rotation direction (the circumferential direction). The rotary table 21 is connected to the housing box 22 via a connection 214 (FIG. 3).

Each of the stages 211 has a disc shape slightly larger than the substrate W and is formed, for example, by quartz. The substrate W is placed on each of the stages 211. Each of the stages 211 is connected to a rotation motor 213 via the rotating shaft 212 and is configured to be relatively rotatable with respect to the rotary table 21 (FIG. 1).

The rotating shaft 212 connects the lower surface of the stage 211 to the rotation motor 213 contained within the housing box 22 and transmits power of the rotation motor 213 to the stage 211. The rotating shaft 212 passes through a ceiling 222 of the housing box 22 and through the rotary table 21. A seal 263 is provided near the penetration of the ceiling 222 of the housing box 22 to maintain airtightness within the housing box 22. Examples of the seal 263 include a magnetic fluid seal.

The rotation motor 213 is a rotation source that rotates the stage 211 via the rotating shaft 212 to rotate the substrate W around the center of the stage 211. The rotation motor 213 is preferably a servomotor, for example.

The connection 214 connects the lower surface of the rotary table 21 and the upper surface of the housing box 22 (FIG. 3). A plurality of connections 214 are provided along the circumferential direction of the rotary table 21.

The housing box 22 is provided below the rotary table 21 in the processing chamber 11. The housing box 22 is connected to the rotary table 21 via the connection 214 and rotates integrally with the rotary table 21. The housing box 22 may be configured to be liftable within the processing chamber 11 by means of a lifting mechanism (not illustrated). The housing box 22 includes a body 221 and the ceiling 222.

The body 221, which has an upwardly open recess (FIG. 1), extends in the direction of rotation of the rotary table 21 to form an annular shape. The ceiling 222 is provided on the top of the body 221 to cover the opening of the recess in the body 221. The body 221 and the ceiling 222 together form a rotation housing 223 that provides a space isolated from the inner space of the processing chamber 11.

The rotation housing 223, which has a rectangular shape in a vertical cross-sectional view, extends in the direction of rotation of the rotary table 21 to form an annular shape. The rotation housing 223 accommodates the rotation motor 213. A communication passage 224 is formed in the body 221 for communicating the rotation housing 223 with the outside of the deposition apparatus 1. Accordingly, outside air is introduced into the rotation housing 223 from the outside of the deposition apparatus 1, which cools the inside of the rotation housing 223 and also maintains an atmospheric pressure therein. In order to rotatably arrange the rotation housing 223, the processing chamber 11 includes a rotation source housing space 19 surrounded by the sidewall 113, the bottom plate 114, and the heating unit 15.

The rotating shaft 23 is fixedly connected to a lower part of the housing box 22. The rotating shaft 23 is provided through the bottom plate 114 of the processing chamber 11. The rotating shaft 23 transmits the power of the revolution motor 24 to the rotary table 21 and to the housing box 22, to rotate the rotary table 21 and the housing box 22 together. A seal 154 is provided between the outer wall of the stationary shaft 151 and the inner wall of the rotating shaft 23 of the rotary drive device 20. Thus, the rotating shaft 23 rotates with respect to the stationary shaft 151 while maintaining the airtightness inside the processing chamber 11. Examples of the seal 154 include a magnetic fluid seal.

The outer barrel 25 of the rotary drive device 20 is connected to a central lower surface of the bottom plate 114 of the processing chamber 11. The outer barrel 25, together with the stationary shaft 151 of the processing chamber 11, supports the processing chamber 11. A seal 116 is provided between the rotating shaft 23 and the outer barrel 25 to maintain the airtightness within the processing chamber 11. Examples of the seal 116 include a magnetic fluid seal.

The gas introduction section 12 includes an inert gas supplier 27 for supplying the inert gas to the shaft space between the rotating shaft 23 and the outer barrel 25. The inert gas supplier 27 includes a gas supply 27a outside the processing chamber 11 and supplies the inert gas into the shaft space under the control of the controller 90. The shaft space communicates with the rotation source housing space 19. The inert gas supplied to the shaft space flows into the rotation source housing space 19.

A passage 231 is formed inside the rotating shaft 23. The passage 231 is connected to the communication passage 224 of the housing box 22 and functions as a fluid flow passage for introducing air into the housing box 22. The passage 231 also functions as a wiring duct for introducing power lines and signal lines into the housing box 22, for driving the rotation motor 213. The passages 231 are provided, for example, to be same in number as the rotation motors 213.

The controller 90 controls each part of the deposition apparatus 1. The controller 90 may be, for example, a computer having a processor, a memory, and an I/O interface, which are not illustrated. Computer programs for operating each part of the deposition apparatus 1 are stored in the memory. The memory may be, for example, a flexible disk, a compact disk, a hard disk, a flash memory, a DVD, and the like.

[Configuration of Gas Exhauster 13]

Next, the configuration of the gas exhauster 13 of the deposition apparatus 1 will be described in detail with reference to FIGS. 1 and 2. In the gas exhauster 13, a plurality of exhaust ports 131a, 131b, and 137a are provided above the substrate W placed on the stage 211 in the raw material gas adsorption region P1 and in the reaction gas supply region P2, for evacuating gas from the interior space of the processing chamber 11. Accordingly, in the raw material gas adsorption region P1 and in the reaction gas supply region P2, the flow of gas to the lower surface side of the stage 211 is prevented. Meanwhile, the gas exhauster 13 allows the supplied separation gas to flow to the lower surface side of the stage 211 in the plurality of separation regions D.

Specifically, the gas exhauster 13 includes an outer exhaust structure 131 which is circularly disposed along a circumferential direction of the processing chamber 11 radially outside of the rotary table 21, and an axial exhauster 137 which is provided at an adjacent position of the protrusion 18 in the raw material gas adsorption region P1.

The outer exhaust structure 131 includes a ring member 132 provided in contact with the bottom wall of the body 111, a spacer 133 stacked on the ring member 132, and a cover member 134 stacked on the spacer 133.

The ring member 132 has an endless shape that is circularly disposed along the inner circumferential surface of the body 111 in a plane view. The ring member 132 has an upwardly open recess in a side cross-sectional view, having a gas flow passage 132a therein. The gas flow passage 132a is continuous around the entire circumference of the ring member 132.

The ring member 132 also includes an external communication port 132b for communicating with the gas flow passage 132a, at a predetermined position on the bottom wall. The external communication port 132b communicates with the flow passage of an exhaust pipe 135 provided outside the processing chamber 11 via a communication hole 111a formed in the body 111. The exhaust pipe 135 is provided with an exhaust device 136 that causes gas to flow in the exhaust pipe 135. The exhaust device 136 may include, for example, a pump to suction the gas in the processing chamber 11, a flow control valve to adjust the flow rate of the gas to be exhausted, and the like.

The spacer 133 is provided around the entire circumference of the ring member 132 and covers the top of the gas flow passage 132a. The spacer 133 is positioned exactly laterally (at the same height) of the rotary table 21 in a side cross-sectional view. The spacer 133 has its inner peripheral surface positioned radially outside of the inner peripheral surface of the ring member 132 and is non-contact with the rotary table 21. Accordingly, by the spacer 133, the cover member 134 is positioned slightly higher than the rotary table 21. At the appropriate location on the spacer 133, an exhaust passage 133a is formed for communicating the first exhaust port 131a and the second exhaust port 131b of the cover member 134, and the gas flow passage 132a of the ring member 132, which will be described later.

The cover member 134 is formed into an annular plate which is provided around the entire circumference of the spacer 133. In the assembled state of the outer exhaust structure 131, the lower surface of the cover member 134 is positioned above the upper surface of the rotary table 21 in a vertical direction. The cover member 134 has an inner edge projecting radially inwardly relative to the inner peripheral surface of the spacer 133. Thus, the inside of the cover member 134 is positioned non-contact above the outer edge of the rotary table 21.

The outer exhaust structure 131 includes the first exhaust port 131a and the second exhaust port 131b passing through the cover member 134 (see also FIG. 2). Because the cover member 134 is at a higher position than the rotary table 21, the first exhaust port 131a and the second exhaust port 131b can exhaust gases in the processing chamber 11 above the rotary table 21 in the vertical direction. The gas taken into the first exhaust port 131a and the second exhaust port 131b flows into the gas flow passage 132a via the exhaust passage 133a and is further discharged into the flow passage of the exhaust pipe 135 via the external communication port 132b and the communication hole 111a.

As illustrated in FIG. 2, the first exhaust port 131a is formed adjacent to and radially outside of the raw material gas adsorption region P1, and is formed in the first exhaust region E1, which is in communication with the raw material gas adsorption region P1. The first exhaust port 131a is positioned at the downstream side of the rotation direction (clockwise in FIG. 2) of the rotary table 21 in the raw material gas adsorption region P1. Thus, the first exhaust port 131a passes the raw material gas supplied to the raw material gas adsorption region P1 and the separation gas supplied to the separation region D adjacent to the raw material gas adsorption region P1.

The second exhaust port 131b is formed adjacent to and radially outside of the reaction gas supply region P2, and is formed in the second exhaust zone E2, which is in communication with the reaction gas supply region P2. The second exhaust port 131b is positioned at the downstream side of the rotation direction (clockwise in FIG. 2) of the rotary table 21 in the reaction gas supply region P2. Thus, the second exhaust port 131b passes the reaction gas supplied to the reaction gas supply region P2 and the separation gas supplied to the reaction gas supply region P2.

As illustrated in FIGS. 1 and 2, the axial exhauster 137 is provided adjacent to the radially inward part of the raw material gas adsorption region P1. The axial exhauster 137 includes an upper exhaust port 137a formed in the top plate 112 and an exhaust port 138 communicating with the upper exhaust port 137a. The axial exhauster 137 may be provided not only in the raw material gas adsorption region P1, but also in the radially inward part of the reaction gas supply region P2, or only in the reaction gas supply region P2.

The upper exhaust port 137a is positioned radially inward relative to the stage 211 of the rotary table 21 and penetrates the top plate 112. Accordingly, the upper exhaust port 137a does not face the substrate W placed on the stage 211. The upper exhaust port 137a is formed at a position overlapping the imaginary radial line extending from the center of the processing chamber 11 (the rotation center of the rotary table 21) toward the first exhaust port 131a.

The exhaust port 138 protrudes upward from the top plate 112 to connect with the exhaust line 139 outside the processing chamber 11. The exhaust port 138 includes an internal flow passage 138a that communicates the upper exhaust port 137a and the flow passage of the exhaust line 139. The exhaust line 139 is connected to the exhaust device 136 outside the processing chamber 11.

The gas exhauster 13 described above can guide the raw material gas and the separation gas above the rotary table 21 in the raw material gas adsorption region P1. Similarly, the gas exhauster 13 can guide the reaction gas and the separation gas above the rotary table 21 in the reaction gas supply region P2.

[Substrate Processing Method]

Figure 5A:
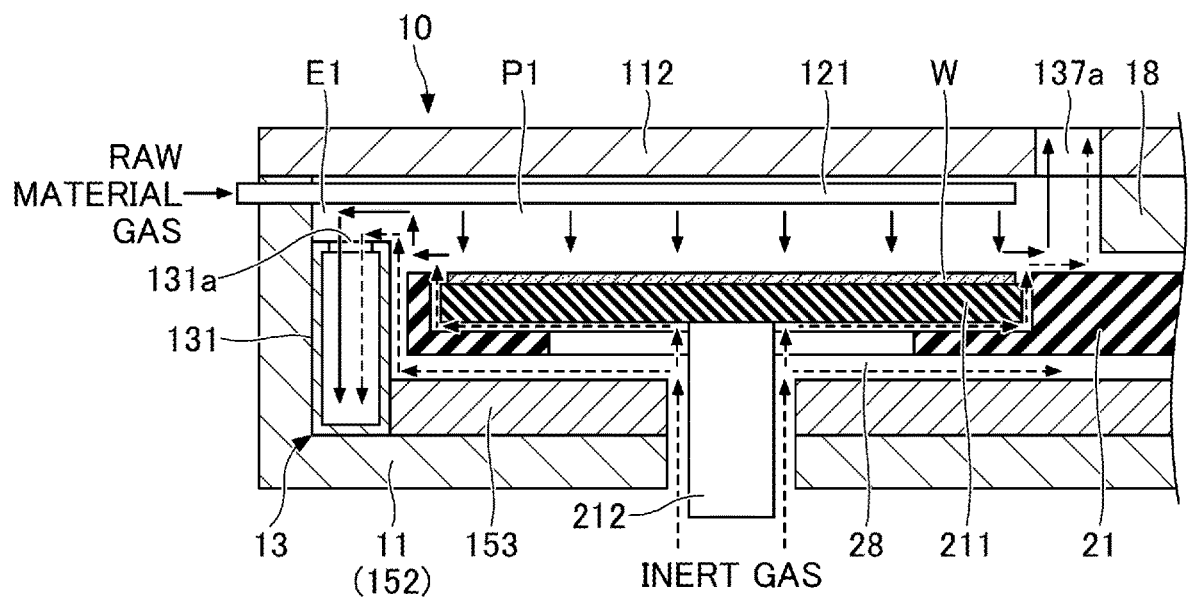
FIGS. 5A and 5B are schematic views illustrating exhaust operations of gases by a gas exhauster.
Figure 5B:
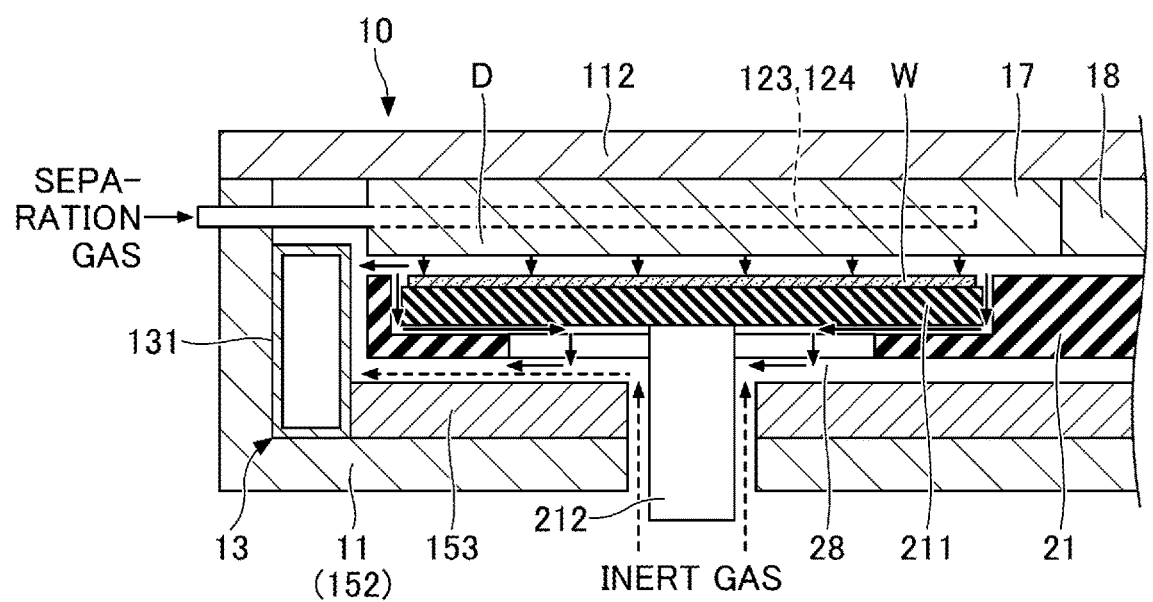

The deposition apparatus 1 according to the present embodiment is basically configured as described above, and the operation (a substrate processing method) will be described below with reference to FIGS. 4 and 5. FIG. 4 is a flowchart illustrating a processing flow of the substrate processing method. FIGS. 5A and 5B are schematic views illustrating exhaust operations of gases by the gas exhauster 13, wherein FIG. 5A illustrates the flow of the gas in the raw material gas adsorption region P1 and FIG. 5B illustrates the flow of the gas in the separation region D.

As illustrated in FIG. 4, the substrate processing method includes a loading step (step S1), a depressurization step (step S2), a rotation step (step S3), a separation gas supply step (step S4), a process gas supply step (step S5), and an unloading step (step S6). The controller 90 controls each configuration of the deposition apparatus 1 and performs each step at appropriate timing.

In the loading step (step S1), under the control of the controller 90, the transfer arm 14a enters through the loading port 14 with the gate valve open, and the substrate is transferred (placed) on each of the stages 211 of the rotary table 21 provided in the processing chamber 11. Under the control of the controller 90, after placing the substrate W on the stage 211, the gate valve is closed and the processing chamber 11 is sealed.

In the depressurization process (step S2), under the control of the controller 90, the gas exhauster 13 is operated to exhaust the gas inside the processing chamber 11 through each of the exhaust ports (the first exhaust port 131a, the second exhaust port 131b, and the upper exhaust port 137a), which communicate with the inside of the processing chamber 11. Accordingly, the pressure of the space inside the processing chamber 11 is reduced to a predetermined level. Then, under the control of the controller 90, by continuously controlling the operation of the gas exhauster 13, the reduced pressure in the depressurization step is maintained until the start of the unloading step.

In the rotation step (step S3), under the control of the controller 90, the rotary table 21 is revolved. Under the control of the controller 90, each of the stages 211 on which the substrate W is placed is rotated relative to the rotary table 21.

In the separation gas supply step (step S4), under the control of the controller 90, the separation gas is supplied from each of the separation gas nozzles 123 and 124 provided within the processing chamber 11 to form a plurality of separation regions D.

Under the control of the controller 90, as a deposition process (a substrate processing) for the substrate W, the process gas supply step (step S5) is performed in which the raw material gas is supplied from the raw material gas nozzle 121 and the reaction gas is supplied from the reaction gas nozzle 122. The process gas supply step may be performed simultaneously with the separation gas supply step.

In each substrate W, which revolves and rotates by the rotary table 21, the raw material gas is adsorbed when it passes through the raw material gas adsorption region P1, and the reaction gas reacts with the adsorbed raw material gas when it passes through the reaction gas supply region P2. In the deposition process, by continuing steps S2 to S5 for a predetermined period of time, a film having a desired thickness is formed on the surface of the substrate W.

When the deposition process is completed, under the control of the controller 90, the depressurization of the processing chamber 11 and the supply of the process gas are stopped, the pressure inside the processing chamber 11 is increased, and the supply of the separation gas is stopped in an appropriate pressure condition. Under the control of the controller 90, the rotation of the rotary table 21 and each of the stages 211 are stopped so that the substrate W on each of the stages 211 can be removed.

In the unloading step (step S6), under the control of the controller 90, the transfer arm 14a enters through the loading port 14 with the gate valve open, and the substrate W is unloaded from each of the stages 211 of the rotary table 21.

In the depressurization step (step S2) to the process gas supply step (step S6) of the substrate processing method described above, the gas exhauster 13 continues to evacuate the gas in the processing chamber 11. In particular, in the process gas supply step, the process gas supplied into the processing chamber 11 is continuously evacuated through the plurality of exhaust ports 131a, 131b, and 137a. Next, the flow of the process gas and the separation gas when the gases are exhausted by the gas exhauster 13 (the depressurization step) in the deposition process (when the process gas and the separation gas are supplied) will be described.

As illustrated in FIG. 5B, in the substrate processing, the separation gas nozzles 123 and 124 discharge the separation gas from above the rotary table 21 toward the substrate W placed on the stage 211. As described above, because the projecting portion 17 is provided in the separation region D, the space between the projecting portion 17 and the rotary table 21 is narrowed. This increases the internal pressure of the separation gas and prevents the inflow of the process gas (the raw material gas and the reaction gas) into the separation region D.

The inert gas supplier 27 supplies the inert gas to the rotation source housing space 19 below the body 111. The inert gas flows into the space between the rotary table 21 and the heater 153 (hereinafter referred to as an under-table space 28) through the gap between the rotating shaft 212, which axially supports the stage 211, the body 111, and the heating unit 15.

A portion of the separation gas supplied to the separation region D flows radially outwardly above the rotary table 21. The other portion of the separation gas passes through the gap between the rotary table 21 and the stage 211, goes around to the lower surface side of the stage 211, and further flows to the under-table space 28. In the under-table space 28, the separation gas is mixed with the inert gas from the rotation source housing space 19. The separation gas and the inert gas flow radially outward in the under-table space 28.

Meanwhile, as illustrated in FIG. 5A, in the raw material gas adsorption region P1, the raw material gas nozzle 121 discharges the raw material gas from above the rotary table 21 toward the substrate W placed on the stage 211. Accordingly, the raw material gas is adsorbed to the upper surface of the substrate W. The inert gas flows into the under-table space 28 in the raw material gas adsorption region P1, from the rotation source housing space 19 below the body 111.

The gas exhauster 13 according to the present embodiment includes the first exhaust port 131a at a radially outward adjacent position and the upper exhaust port 137a at a radially inward adjacent position, in the raw material gas adsorption region P1. The first exhaust port 131a and the upper exhaust port 137a are arranged above the rotary table 21 in a vertical direction (proximate to the raw material gas nozzle 121). Accordingly, in the raw material gas adsorption region P1, a flow is formed in which the gas is directed upward from the under-table space 28.

Specifically, a portion of the inert gas flowing into the under-table space 28 moves to the lower surface side of the stage 211, and is directed to the space above the rotary table 21 through the space between the rotary table 21 and the stage 211. The other portion of the inert gas flowing into the under-table space 28 moves radially outward of the under-table space 28, and is directed to the space above the rotary table 21 through the space between the rotary table 21 and the ring member 132.

In the space above the rotary table 21, the raw material gas supplied from the raw material gas nozzle is mixed with the inert gas. The raw material gas and the inert gas are directed to the first exhaust port 131a and the upper exhaust port 137a under suction action of the exhaust device 136 via the first exhaust port 131a and the upper exhaust port 137a. The first exhaust port 131a is positioned radially outside relative to the rotary table 21 and at a higher position than the rotary table 21, so that the raw material gas and the inert gas can be stably guided upward. Similarly, the upper exhaust port 137a is positioned radially inward relative to each of the stages 211 and at a higher position than the rotary table 21, so that the raw material gas and the inert gas can be stably guided upward.

Here, in a case where the first exhaust port is positioned below the rotary table 21 in the vertical direction, the raw material gas supplied to the space above the rotary table 21 moves downward. At this time, the raw material gas is more likely to go around into the gap between the stage 211 and the rotary table 21. In particular, in the configuration of rotating the stage 211, there is inevitably a gap between the stage 211 and the rotary table 21. Therefore, when the first exhaust port is lower than the rotary table 21, the raw material gas goes around to the lower surface side of the stage 211. The raw material gas that goes around the lower surface side of the stage 211 attaches to the lower surface of the stage 211, thereby increasing the possibility of affecting the rotation of the stage 211.

In contrast, in the deposition apparatus 1 according to the present embodiment, because the first exhaust port 131a is provided above the rotary table 21 in the vertical direction, the raw material gas can be prevented from going around to the space between the stage 211 and the rotary table 21. That is, the inert gas (or the separation gas from the separation region D) is directed into the gap between the stage 211 and the rotary table 21, and these gases flow directly into the space above the rotary table 21 and are directed to the upper first exhaust port 131a.

In particular, in the deposition apparatus 1 according to the present embodiment, the upper exhaust port 137a is provided radially inwardly, so that the raw material gas and the inert gas on the rotation center side of the rotary table 21 can be smoothly discharged from the upper exhaust port 137a without directing the raw material gas and the inert gas radially outwardly. Accordingly, the raw material gas is not left on the rotation center side of the rotary table 21, and thus the raw material gas can be prevented from going around to the lower surface side of the stage 211 more reliably.

In addition, in the deposition apparatus 1, the reaction gas and the inert gas can be guided upwardly by the second exhaust port 131b provided above the rotary table 21 in the vertical direction, in the reaction gas supply region P2. Accordingly, in the reaction gas supply region P2 also, the raw material gas can be prevented from going around to the lower surface side of the stage 211.

The deposition apparatus 1 may be a configuration in which the first exhaust port 131*a* of the raw material gas adsorption region P1 is higher than the rotary table 21, while the second exhaust port 131*b* of the reaction gas supply region P2 is lower than the rotary table 21. Conversely, the deposition apparatus 1 may be a configuration in which the second exhaust port 131*b* of the reaction gas supply region P2 is higher than the rotary table 21, while the first exhaust port 131*a* of the raw material gas adsorption region P1 is lower than the rotary table 21. Even when one of the raw material gas adsorption region P1 and the reaction gas supply region P2 evacuates above the rotary table 21 and the other evacuates below the rotary table 21, mixing of the raw material gas and the reaction gas on the lower surface side of the rotary table 21 can be prevented. Therefore, it is possible to prevent the deposition on the lower surface side of the rotary table 21, and the generation of particles can be prevented.

The deposition apparatus 1 may include a plasma processing region in which the substrate W is plasma-processed on the rotation path of the rotary table 21. For example, the plasma processing region is provided between the reaction gas supply region P2 and the separation region D on the downstream side of the rotation direction (clockwise) of the rotary table 21.

The technical ideas and effects of the present disclosure described in the above embodiments will be described below.

A substrate processing apparatus (a deposition apparatus 1) according to a first aspect of the present disclosure includes: a processing chamber 11 for processing a substrate W transferred therein; a rotary table 21 rotatably provided inside the processing chamber 11; a stage 211 that is rotatable relative to the rotary table 21 at a position spaced apart from a rotation center of the rotary table 21, and that is configured to receive the substrate W thereon; a process gas supplier 12*a* that is provided above the rotary table 21 and that is configured to supply a process gas to the substrate W placed on the stage 211; a separation gas supplier 12*b* that is configured to supply a separation gas to separation regions, each of the separation regions D being adjacent to a processing region to which the process gas is supplied; and a gas exhauster 13 that includes one or more exhaust ports 131*a*, 131*b*, and 137*a* communicating with an inside of the processing chamber 11 and that are configured to exhaust a gas through the one or more exhaust ports 131*a*, 131*b*, and 137*a*, wherein the one or more exhaust ports 131*a*, 131*b*, and 137*a* are provided in the processing region between the separation regions D and are provided above the rotary table 21.

According to the above, in the substrate processing apparatus (the deposition apparatus 1), the exhaust ports 131*a*, 131*b*, and 137*a* are provided above the rotary table 21, so that the process gas supplied to the substrate W can be guided upward to the exhaust ports 131*a*, 131*b*, and 137*a*. Accordingly, it is possible to prevent the process gas supplied into the processing chamber 11 from going around to the lower surface side of the stage 211, thereby preventing the process gas from being attached on the lower surface of the stage 211. In addition, the process gas which is prevented from going around to the stage 211 is guided toward the exhaust ports 131*a*, 131*b*, and 137*a* by the separation region D of the separation gas in the space above the substrate W, so that the process gas is smoothly exhausted. For example, in the configuration of supplying a plurality of process gases, the mixing of the plurality of process gases can be more reliably prevented.

At least one of the one or more exhaust ports 131*a* and 131*b* may be provided outside the outer edge of the rotary table 21. Accordingly, the exhaust ports 131*a* and 131*b* can well guide the process gas toward the outer edge of the rotary table 21 in the centrifugal direction without blocking the supply of the process gas to the substrate W on the stage 211.

The gas exhauster 13 may include an outer exhaust structure 131 that is provided outside the outer edge of the rotary table 21 and that is circularly disposed along an inner peripheral surface of the processing chamber 11. The outer exhaust structure 131 may include a member (the cover member 134) provided above the rotary table 21, the member having the one or more exhaust ports 131*a* and 131*b* outside the outer edge of the rotary table 21. Accordingly, in the substrate processing apparatus (the deposition apparatus 1), the exhaust ports 131*a* and 131*b* can be easily provided above the rotary table 21.

At least one of the one or more exhaust ports 137*a* may be provided closer to the rotation center of the rotary table 21 than is the stage 211. Accordingly, in the substrate processing apparatus (the deposition apparatus 1), the process gas can be easily exhausted even on the rotation center side of the rotary table 21.

The processing chamber 11 may also include a body 111 having a recess, and a top plate 112 that closes an upper side of the body 111. The at least one of the one or more exhaust ports 137*a*, which is provided closer to the rotation center of the rotary table 21 than is the stage, may be provided on the top plate 112. Accordingly, in the substrate processing apparatus (the deposition apparatus 1), the exhaust port 137*a* can be easily provided above the rotary table 21 near the center of the processing chamber 11.

The processing region may be a raw material gas adsorption region P1 to which a raw material gas that is to be attached to the substrate is supplied. Accordingly, in the substrate processing apparatus (the deposition apparatus 1), the raw material gas in the raw material gas adsorption region P1 can be exhausted from the exhaust ports 131*a* and 137*a* without moving the raw material gas to the lower surface side of the stage 211.

The processing region may be a reaction gas supply region P2 to which a reaction gas that is to react with the raw material gas attached to the substrate W is supplied. Accordingly, in the substrate processing apparatus (the deposition apparatus 1), the reaction gas in the reaction gas supply region P2 can be evacuated from the exhaust port 131*b* without moving the reaction gas to the lower surface side of the stage 211.

The processing chamber 11 may include two processing regions separated by the separation regions D. The two processing regions are respectively a raw material gas adsorption region P1 to which a raw material gas that is to attach to the substrate W is supplied, and a reaction gas supply region P2 to which a reaction gas that is to react with the raw material gas attached to the substrate is supplied. Accordingly, in the substrate processing apparatus (the deposition apparatus 1), the raw material gas and the reaction gas can be evacuated from the exhaust ports 131*a*, 131*b*, and 137*a* while depositing well on the substrate W. As a result, it is possible to prevent mixing of the raw material gas and the reaction gas on the lower surface side of the stage 211, thereby preventing the deposition on the stage 211.

The processing chamber 11 may include two processing regions separated by the separation regions D. In one of the two processing regions, a part of the exhaust ports may be provided above the rotary table 21, and, in another of the two processing regions, an exhaust port may be provided below the rotary table 21. Even in this case, in the substrate processing apparatus (the deposition apparatus 1), a plurality of process gases can be prevented from mixing on the lower surface side of the rotary table 21, thereby avoiding the deposition on the lower surface side of the rotary table 21 and preventing a particle.

An inert gas supplier 27 may be provided that is capable of introducing an inert gas into an under-table space 28 between the rotary table 21 and the processing chamber 11. The one or more exhaust ports 131a, 131b, and 137a may exhaust the inert gas together with the process gas. Accordingly, in the substrate processing apparatus (the deposition apparatus 1), the inert gas can flow from the lower surface side of the stage 211 to above the rotary table 21, thereby more reliably limiting the movement of the process gas.

A substrate processing method according to the second aspect of the present disclosure includes: transferring a substrate W to a rotary table 21 provided inside a processing chamber 11; while rotating the rotary table 21, relatively rotating a stage 211 that is provided at a position spaced apart from a rotation center of the rotary table 21, wherein the substrate W is placed on the stage; supplying a process gas to the substrate W placed on the stage 211 from above the rotary table 21; supplying a separation gas to separation regions D, each of the separation regions being adjacent to a processing region to which the process gas is supplied; and exhausting a gas through one or more exhaust ports 131a, 131b, and 137a that communicate with an inside of the processing chamber 11. In the exhausting the gas, the gas is exhausted from the one or more exhaust ports 131a, 131b, and 137a that are provided in the processing region between the separation regions D and are provided above the rotary table 21. Even in this case, in the substrate processing method, the process gas supplied into the processing chamber 11 can be prevented from going around to the lower surface side of the stage 211.

The substrate processing apparatus and the substrate processing method according to the embodiments disclosed herein are exemplary in all respects and are not limiting. Embodiments may be modified and improved in various forms without departing from the scope and spirit of the appended claims. The matters described in the above embodiments may take other configurations within a consistent range, and may be combined within a consistent range.

According to one aspect, the process gas supplied into the processing chamber can be prevented from going around to the lower surface side of the stage.

What is claimed is:

1. A substrate processing apparatus comprising:
   a processing chamber into which a substrate is transferred;
   a rotary table rotatably provided inside the processing chamber;
   a stage that is rotatable relative to the rotary table at a position spaced apart from a rotation center of the rotary table, wherein the stage is configured to receive the substrate thereon;
   a process gas supplier that is provided above the rotary table and that is configured to supply a process gas to the substrate placed on the stage;
   a separation gas supplier that is configured to supply a separation gas to separation regions, each of the separation regions being adjacent to a processing region to which the process gas is supplied; and
   a gas exhauster that includes one or more exhaust ports communicating with an inside of the processing chamber and that are configured to exhaust a gas through the one or more exhaust ports,
   wherein the one or more exhaust ports are provided in the processing region between the separation regions and are provided above the rotary table,
   wherein at least one of the one or more exhaust ports is provided outside an outer edge of the rotary table,
   wherein the gas exhauster includes an outer exhaust structure that is provided outside the outer edge of the rotary table in a radial direction of the rotary table and that is circularly disposed along an inner peripheral surface of the processing chamber,
   wherein the outer exhaust structure includes a member provided above an upper face of the rotary table in an axial direction of the rotary table, the member having the one or more exhaust ports outside the outer edge of the rotary table in the radial direction of the rotary table,
   wherein at least one of the one or more exhaust ports that are provided at the member above the upper face of the rotary table open upwardly in the axial direction of the rotary table while the process gas supplier supplies the process gas to the substrate placed on the stage and are provided only in the processing region,
   wherein the inert gas supplier is configured so that the inert gas flows upwardly from the under-table space to the at least one of the one or more exhaust ports that are provided at the member above the upper face of the rotary table,
   the rotary table and the outer exhaust structure are arranged so as to form a first gap therebetween, and the rotary table and the stage are arranged so as to from a second gap therebetween, and
   the inert gas flows upwardly through the first gap and the second gap.

2. The substrate processing apparatus according to claim 1, wherein at least one of the one or more exhaust ports is provided closer to the rotation center of the rotary table than is the stage.

3. The substrate processing apparatus according to claim 2,
   wherein the processing chamber includes a body having a recess, and a top plate that closes an upper side of the body, and
   wherein the at least one of the one or more exhaust ports, which is provided closer to the rotation center of the rotary table than is the stage, is provided on the top plate.

4. The substrate processing apparatus according to claim 3, wherein the processing region is a raw material gas adsorption region to which a raw material gas that is to be attached to the substrate is supplied.

5. The substrate processing apparatus according to claim 3, wherein the processing region is a reaction gas supply region to which a reaction gas that is to react with the raw material gas attached to the substrate is supplied.

6. The substrate processing apparatus according to claim 3,
   wherein the processing chamber includes two processing regions separated by the separation regions, and
   wherein the two processing regions are respectively a raw material gas adsorption region to which a raw material gas that is to attach to the substrate is supplied, and a reaction gas supply region to which a reaction gas that is to react with the raw material gas attached to the substrate is supplied.

7. The substrate processing apparatus according to claim 3,
wherein the processing chamber includes two processing regions separated by the separation regions, and
wherein, in one of the two processing regions, the one or more exhaust ports is provided above the rotary table, and, in another of the two processing regions, an exhaust port is provided below the rotary table.

8. The substrate processing apparatus according to claim 4,
wherein an inert gas supplier is provided that is capable of introducing an inert gas into an under-table space between the rotary table and the processing chamber, and
wherein the one or more exhaust ports exhaust the inert gas together with the process gas.

9. The substrate processing apparatus according to claim 5,
wherein an inert gas supplier is provided that is capable of introducing an inert gas into an under-table space between the rotary table and the processing chamber, and
wherein the one or more exhaust ports exhaust the inert gas together with the process gas.

10. The substrate processing apparatus according to claim 6,
wherein an inert gas supplier is provided that is capable of introducing an inert gas into an under-table space between the rotary table and the processing chamber, and
wherein the one or more exhaust ports exhaust the inert gas together with the process gas.

11. The substrate processing apparatus according to claim 1, wherein at least one of the one or more exhaust ports is provided closer to the rotation center of the rotary table than is the stage.

12. The substrate processing apparatus according to claim 11,
wherein the processing chamber includes a body having a recess, and a top plate that closes an upper side of the body, and
wherein the at least one of the one or more exhaust ports, which is provided closer to the rotation center of the rotary table than is the stage, is provided on the top plate.

13. The substrate processing apparatus according to claim 1, wherein the processing region is a raw material gas adsorption region to which a raw material gas that is to be attached to the substrate is supplied.

14. The substrate processing apparatus according to claim 1, wherein the processing region is a reaction gas supply region to which a reaction gas that is to react with the raw material gas attached to the substrate is supplied.

15. The substrate processing apparatus according to claim 1,
wherein the processing chamber includes two processing regions separated by the separation regions, and
wherein the two processing regions are respectively a raw material gas adsorption region to which a raw material gas that is to attach to the substrate is supplied, and a reaction gas supply region to which a reaction gas that is to react with the raw material gas attached to the substrate is supplied.

16. The substrate processing apparatus according to claim 1,
wherein the processing chamber includes two processing regions separated by the separation regions, and
wherein, in one of the two processing regions, the one or more exhaust ports is provided above the rotary table, and, in another of the two processing regions, an exhaust port is provided below the rotary table.

17. The substrate processing apparatus according to claim 1,
wherein an inert gas supplier is provided that is capable of introducing an inert gas into an under-table space between the rotary table and the processing chamber, and
wherein the one or more exhaust ports exhaust the inert gas together with the process gas.

* * * * *